US006958782B2

(12) United States Patent
Kishi

(10) Patent No.: US 6,958,782 B2
(45) Date of Patent: Oct. 25, 2005

(54) FREQUENCY CONVERTER

(75) Inventor: Takahiko Kishi, Yokohama (JP)

(73) Assignee: Samsung Electronics Co., Ltd. (KR)

( * ) Notice: Subject to any disclaimer, the term of this patent is extended or adjusted under 35 U.S.C. 154(b) by 565 days.

(21) Appl. No.: 10/059,885

(22) Filed: Jan. 29, 2002

(65) Prior Publication Data

US 2002/0158990 A1 Oct. 31, 2002

(30) Foreign Application Priority Data

Jan. 29, 2001 (JP) ........................................ 2001/019997

(51) Int. Cl.[7] ............................ H04N 5/38; H04B 1/707
(52) U.S. Cl. .................. 348/607; 348/659; 375/346
(58) Field of Search ............................. 348/659, 725, 348/726, 607, 611, 614, 627; 455/118, 130, 131, 133, 137; 375/346, 285, 229, 350

(56) References Cited

U.S. PATENT DOCUMENTS

| | | | | |
|---|---|---|---|---|
| 5,140,615 A | * | 8/1992 | Jasper et al. .................. | 375/347 |
| 5,291,081 A | * | 3/1994 | Takeuchi et al. .............. | 327/47 |
| 5,383,220 A | * | 1/1995 | Murai .......................... | 375/150 |
| 5,712,869 A | * | 1/1998 | Lee et al. ..................... | 375/141 |
| 5,805,242 A | * | 9/1998 | Strolle et al. ............... | 348/726 |
| 6,118,810 A | * | 9/2000 | Wynn .......................... | 375/219 |
| 6,246,715 B1 | * | 6/2001 | Park et al. ................... | 375/148 |
| 6,308,057 B1 | * | 10/2001 | Hayashi ....................... | 455/324 |
| 6,535,073 B1 | * | 3/2003 | Garg et al. ................... | 332/103 |
| 6,560,299 B1 | * | 5/2003 | Strolle et al. ................ | 375/347 |
| 6,597,748 B1 | * | 7/2003 | Hietala et al. ............... | 375/324 |
| 6,661,472 B2 | * | 12/2003 | Shintani et al. .............. | 348/732 |
| 6,680,971 B1 | * | 1/2004 | Tazebay et al. .............. | 375/235 |
| 6,701,135 B2 | * | 3/2004 | Posti et al. ................... | 455/103 |
| 6,727,936 B2 | * | 4/2004 | Liu et al. ...................... | 348/21 |
| 6,788,733 B1 | * | 9/2004 | Whang et al. ............... | 375/148 |

FOREIGN PATENT DOCUMENTS

| | | |
|---|---|---|
| JP | 06-022292 | 1/1994 |
| JP | 06-188928 | 8/1994 |
| JP | 07-030463 | 1/1995 |
| JP | 08-125447 | 5/1996 |
| JP | 10-056484 | 2/1998 |
| JP | 10-313261 | 11/1998 |
| JP | 2000-013147 | 1/2000 |
| JP | 2000-022449 | 1/2000 |

* cited by examiner

Primary Examiner—John Miller
Assistant Examiner—Paulos M. Natnael
(74) Attorney, Agent, or Firm—Dilworth & Barrese, LLP

(57) ABSTRACT

There is provided a frequency converter for suppressing generation of an image signal using a simple adaptive algorithm. In the frequency converter, an orthogonal converter 21 converts an RF/IF signal to a complex signal along with frequency conversion and ADCs quantize the complex signal. An image signal canceller achieves the complex conjugate of the quantized complex signal by inverting the imaginary part of the quantized signal through a multiplier. An LMS core adaptively processes the complex signal using the complex conjugate signal as a reference signal and the output of the image signal canceller as an error signal. The resulting cancellation signals are level-matched in attenuators. Subtracters combine the complex signal with the level-adjusted complex conjugate signal.

29 Claims, 10 Drawing Sheets

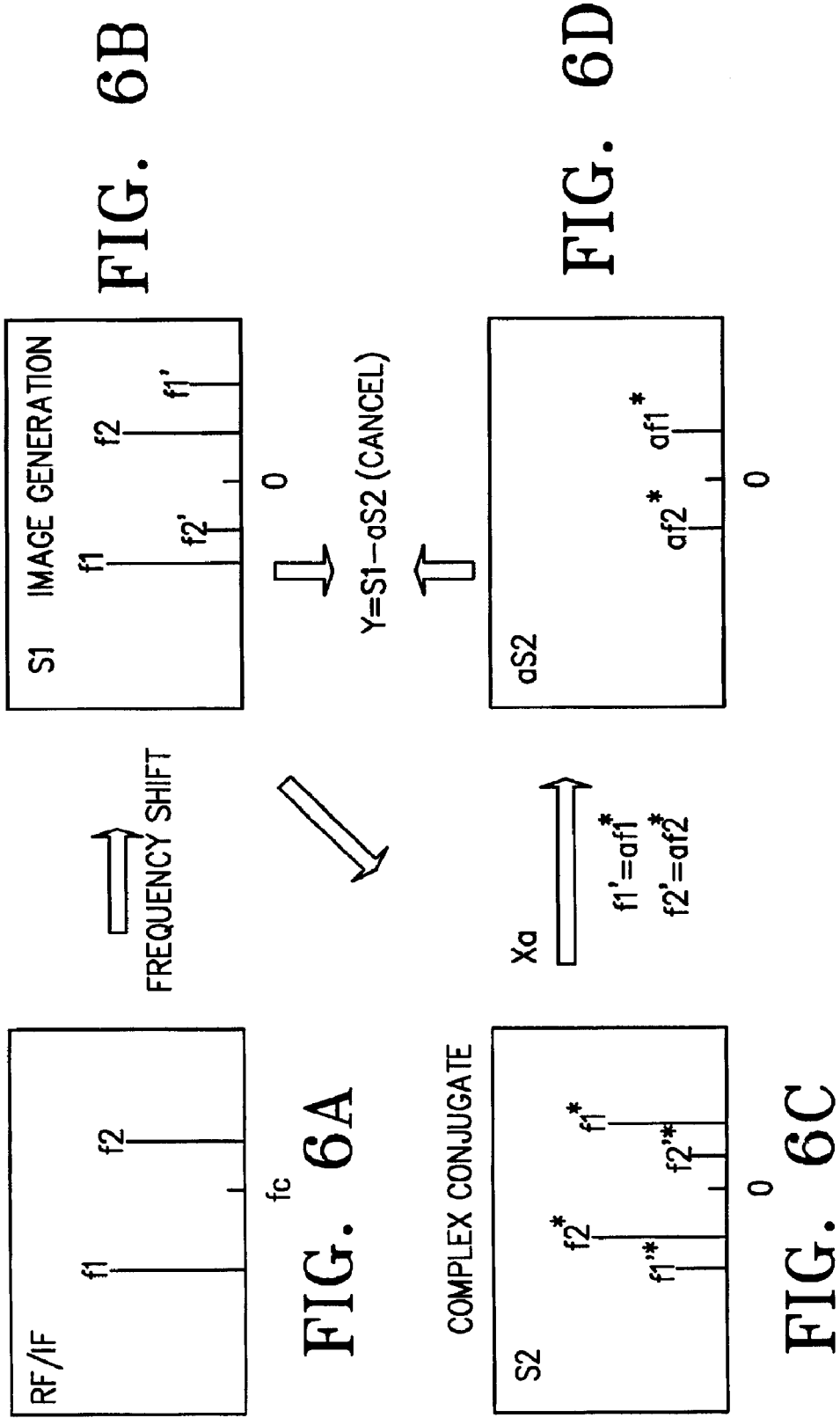

| COEFFICIENT | COEFFICIENT UPDATE FORMULA |
|---|---|
| $h_1$ | $h_{1,k} = h_{1,k-1} + 4Y_q x_q e$ |
| $h_2$ | $h_{2,k} = h_{2,k-1} + 4Y_q x_q e$ |
| $h_3$ | $h_{3,k} = h_{3,k-1} + 4Y_q x_i e$ |

$\sigma$ : AMPLITUDE OF WANTED SIGNAL $e = \sigma^2 - (Y_i^2 + Y_q^2)$

FIG. 7B

FREQUENCY CONVERTER

PRIORITY

This application claims priority to an application entitled "Frequency Converter" filed in the Japanese Property Office on Jan. 29, 2001 and assigned Serial No. 2001-19997, the contents of which are hereby incorporated by reference.

BACKGROUND OF THE INVENTION

1. Field of the Invention

The present invention relates generally to characteristic compensation of an analog part in an orthogonal converter (a real-to-complex mixer) or a complex mixer, and in particular, to a frequency converter for canceling an image signal present in mixer output.

2. Description of the Related Art

In an orthogonal converter or a complex mixer realized by an analog circuit, if a real part is I and an imaginary part is Q, the amplitudes of I and Q are different and the phase difference between I and Q is not exactly 90°. Therefore, an image signal, which should not appear under an ideal circumstances, is observed in the complex conjugate of the signal frequency output from the mixer.

The image signal is generated in the band of the target signal, causing interference with the target (or wanted) signal in the receiver.

An image signal generated simply due to the I–Q amplitude difference is described by $$\begin{aligned}
f(\omega t) &= \cos(\omega t)(A\cos(\omega_c t) - j(A - d)\sin(\omega_c t)) \quad (1)\\
&= \cos(\omega t)(Ae^{-1j\overline{\omega}_c t} + jd\sin(\omega_c t))\\
&= \frac{A}{2}(e^{j(\omega t - \omega_c t)} + e^{-j(\omega t + \omega_c t)}) +\\
&\quad \frac{d}{4}(e^{j(\omega t + \omega_c t)} - e^{j(\omega t - \omega_c t)} + e^{-j(\omega t - \omega_c t)} - e^{-j(\omega t + \omega_c t)})\\
&= \frac{1}{2}\left(A - \frac{d}{2}\right)(e^{j(\omega t - \omega_c t)} + e^{-j(\omega t + \omega_c t)}) +\\
&\quad \frac{d}{4}(e^{-j(\omega t - \omega_c t)} - e^{j(\omega t + \omega_c t)})
\end{aligned}$$

where d=A−B, cos(ωt) is mixer input, lo($\omega_c$t) is a local signal, A and B are amplitudes of the local signal, $\omega_c$ indicates a carrier frequency of the local system and f(ωt)= cos(ωt)lo($\omega_c$t)=cos(ωt)A cos($\omega_c$t)−jB sin($\omega_c$t)) is mixer output.

In equation (1), the first term in the final formulation of the equation represents the target signal, the second term represents the image signal generated due to non-orthogonality of the mixer, and the image frequency is the complex conjugate of the frequency of the target signal in the first term.

The image signal is not generated when perfect orthogonality is established between I and Q, that is, when the second term in Eq. 1 is zero. Thus, some methods of compensating the I–Q orthogonality have been suggested. For example, mixers having the function of adjusting the I–Q orthogonality are disclosed in Japanese Patent Laid-Open No. Hei 7-30463, Japanese Patent Laid-Open No. Hei 8- 125447 (Publication No. 2988277), and Japanese Patent Laid-Open No. 2000-22449. Methods of compensating I–Q characteristics after sampling using an analog-to-digital converter (ADC) are disclosed in Japanese Patent Laid-Open No. Hei 6-188928 and Japanese Patent Laid-Open No. Hei 10-313261.

Image signal cancellation is not perfect by adjustment of I–Q characteristics in the nature of an analog part and adjusted characteristics vary with environmental changes including time and temperature. Thus, compensation is adapted by monitoring mixer output or compensated output, as disclosed in Japanese Patent Laid-Open No. Hei 6-188928, Japanese Patent Laid-Open No. Hei 8-125447 (Publication No. 2988277), Japanese Patent Laid-Open No. Hei 10-56484, Japanese Patent Laid-Open No. Hei 10-313261, Japanese Patent Laid-Open No. 2000-13147, and Japanese Patent Laid-Open No. 2000-22449.

The technology disclosed in Japanese Patent Laid-Open No. Hei 10-56484 will be described below with reference to FIGS. 7A and 7B, by way of example. Referring to FIG. 7A, an orthogonality and amplitude error compensation circuit is placed at the output of an orthogonal converter. The orthogonality and amplitude error compensation circuit calculates the equations of Yi=h3×Xi and Yq=h1×Xq+h2×Xi with two components Xi and Xq received from the orthogonal converter and coefficients h1 and h2 adaptively updated in the formulas shown in FIG. 7B, and achieves orthogonality and an amplitude error-compensated two components Yi and Yq.

However, the above methods basically compensate I–Q orthogonality, neglecting I–Q frequency characteristics. The image suppression varies with frequency within a channel band in recent wireless communication systems requiring wide-band orthogonality such as CDMA (Code Division Multiple Access). Thus, though improved constellation effects reduction in BER (Bit Error Rate), there is a limit on BER reduction by image frequency disturbance. In the case of digital signal processing, even if the signal level of an image frequency is much higher than that of a target signal frequency, it is necessary to detect a fine phase difference or amplitude difference. Therefore, a wide dynamic range for signal processing is required.

With these problems overcome, both phase and amplitude should be adjusted. When an adaptive algorithm for digital signal processing is used, a simple algorithm like LMS (Least Mean Squares) is not applicable.

An image signal canceling method disclosed in Japanese Patent Laid-Open No. Hei 6-22292 also has limitations in complying with rapid changes in an input signal due to paging, for example and problems in stability, because it relies on feedback.

SUMMARY OF THE INVENTION

It is, therefore, an object of the present invention to provide a frequency converter for effectively canceling an image signal.

It is another object of the present invention to provide a frequency converter for canceling an image signal through simple adjustment and using a simple adaptive algorithm.

The foregoing and other objects of the present invention are achieved by providing a frequency converter for image signal cancellation. The frequency converter includes an orthogonal converter for receiving a real signal and outputting a complex signal, or a complex mixer for receiving a complex signal and outputting a complex signal, means for obtaining the complex conjugate of the complex signal received from the orthogonal converter or the complex mixer, means for adjusting the level of the complex conjugate signal, and means for combining the complex signal received from the orthogonal converter or the complex mixer with the level-adjusted complex conjugate signal.

BRIEF DESCRIPTION OF THE DRAWINGS

The above and other objects, features and advantages of the present invention will become more apparent from the following detailed description when taken in conjunction with the accompanying drawings in which:

FIGS. 6A to 6D illustrate image signal cancellation in a frequency domain according to the embodiment of the present invention; and FIGS. 7A and 7B illustrate a conventional image canceling circuit.

DETAILED DESCRIPTION OF THE PREFERRED EMBODIMENT

A preferred embodiment of the present invention will be described hereinbelow with reference to the accompanying drawings. In the following description, well-known functions or constructions are not described in detail since they would obscure the invention in unnecessary detail.

The principle of image signal cancellation in a frequency converter according to the present invention will first be described with reference to FIGS. 6A to 6D. FIGS. 6A to 6D illustrate image signal cancellation in the frequency domain.

Referring to FIGS. 6A to 6D, if f1 and f2 are target signals, image signals f1' and f2' as described in the second term of equation (1) are generated after frequency conversion due to non-orthogonality of a mixer. Let a target signal be D and an image signal be U. From the amplitudes and amplitude ratio shown in the first term of equation (1), a D-U amplitude ratio is calculated by $$\frac{D}{U} = \frac{\frac{1}{2}\left(A - \frac{d}{2}\right)}{\frac{d}{4}} = \frac{2}{d}\left(A - \frac{d}{2}\right) = \frac{A+B}{A-B} \quad (2)$$

To remove the second term of equation (1), the complex conjugate signal of equation (1) as shown in FIG. 6C is multiplied by the reciprocal number of equation (2), namely, an image signal suppression degree "a", thereby obtaining aS2 shown in FIG. 6D. Image signal cancellation is completed by subtracting aS2 from S1 shown in FIG. 6B.

This procedure for achieving image signal cancellation, namely S1–aS2, is expressed as $$f_{canceled}(\omega t) = f(\omega t) - \frac{d}{2\left(A - \frac{d}{2}\right)} f^*(\omega t) \quad (3)$$

$$= f(\omega t) - \frac{d}{2\left(A - \frac{d}{2}\right)}\left(\frac{1}{2}\left(A - \frac{d}{e}\right)(e^{-j(\omega t - \omega_c t)} + e^{j(\omega t - \omega_c t)}) + \right.$$

$$\frac{d}{4}(e^{j(\omega t - \omega_c t)} + e^{-j(\omega t + \omega_c t)})$$

$$= \left(\frac{2A - d}{4} - \frac{d^2}{2(2A - d)}\right)(e^{j(\omega t - \omega_c t)} + e^{-j(\omega t + \omega_c t)}) -$$

$$\left(\frac{d}{4} - \frac{d}{4}\right)(e^{-j(\omega t - \omega_c t)} + e^{j(\omega t + \omega_c t)})$$

If $A \gg d$, $$f_{canceled}(\omega t) \approx \frac{A}{2}(e^{j(\omega t - \omega_c t)} + e^{-j(\omega t + \omega_c t)}) \quad (4)$$

Thus, the image signal is cancelled.

Only amplitude error has been considered in the above description. Now, consideration will also be given to phase error.

If the Q phase of a complex output signal deviates by a phase error Φ and (IY, QY) is output for the input of (IX, QX), the calculation of, for example, IY=IX−QX·sin Φ and QY=QX+QX·(cos Φ−1) is carried out before and after an amplitude error canceller. Hence, an image signal can be entirely cancelled even when both amplitude error and phase error are generated.

Since a phase error can be compensated for using an equalizer or an adaptive filter, the image signal can be cancelled as easily as compensation for an amplitude error.

Figure 1:
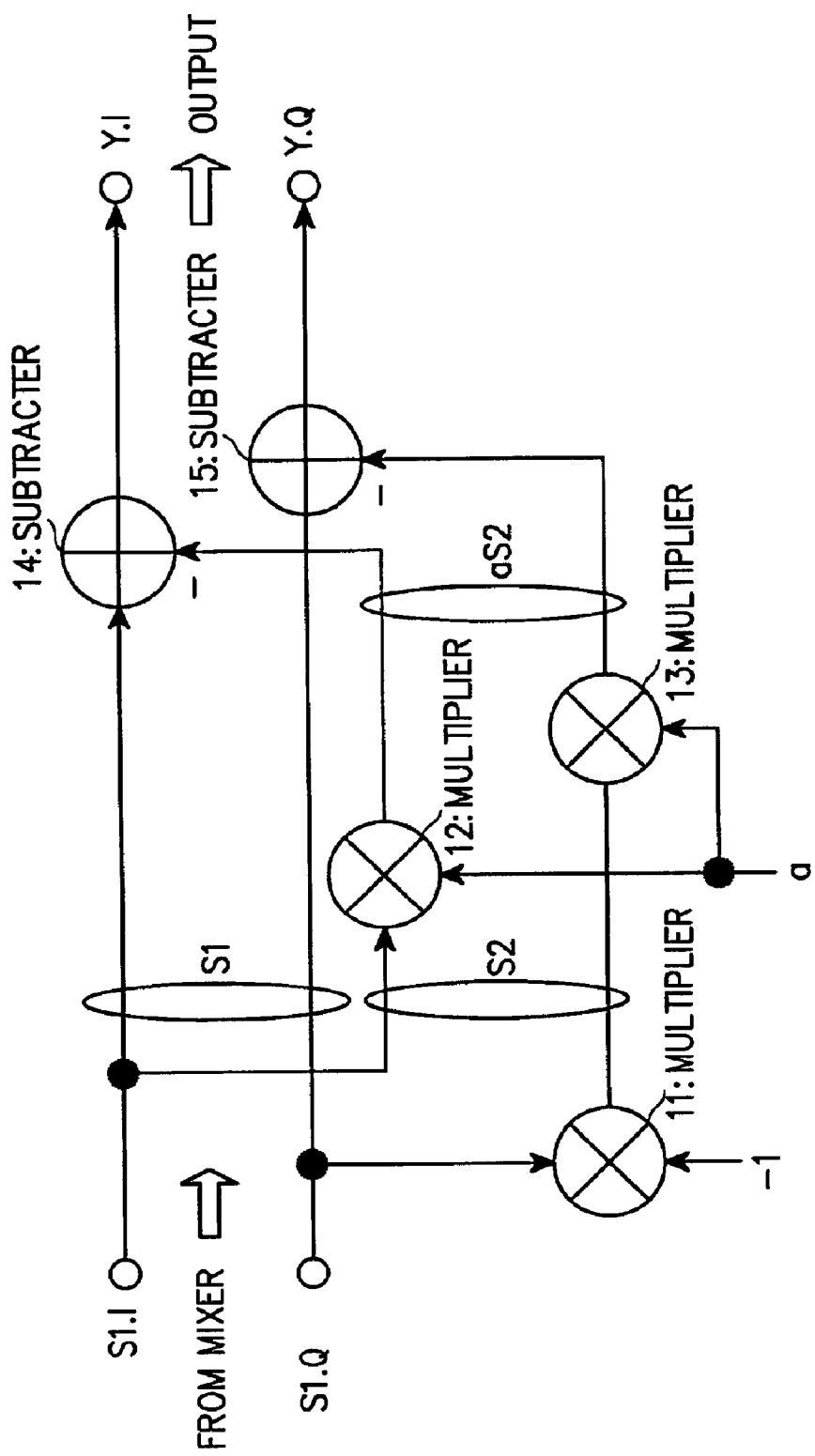
FIG. 1 illustrates the basic structure of an image signal canceling circuit according to an embodiment of the present invention.

The basic structure of an image canceling circuit for performing the above-described operation according to the embodiment of the present invention is shown in FIG. 1. The image canceling circuit is designed to cancel an image signal resulting from non-orthogonality caused by an I-Q amplitude error. The image canceling circuit is comprised of a multiplier 11 for multiplying a signal S1.Q received from an orthogonal converter or a complex mixer by −1 and outputting the complex conjugate signal of a signal (S1.I, S1.Q) received from the orthogonal converter or complex mixer, a multiplier 12 for multiplying the input signal S1.I by an image signal suppression coefficient a and outputting a cancellation signal aS1.I a multiplier 13 for multiplying the signal −S1.Q by the image signal suppression coefficient a and outputting a cancellation signal −aS1.Q, a subtracter 14 for subtracting the cancellation signal aS1.I from S1.I and a subtracter 15 for subtracting −aS1.Q from S1.Q. The cancellation signal is a signal used to cancel the image signal.

The image canceling circuit according to the embodiment of the present invention adjusts the coefficient a so as to minimize the level of a target signal or the level of an image frequency disturbance signal present in symmetry to the target signal with a central frequency interposed. This adjustment method is very simple as compared to the conventional method in which both phase and amplitude are adjusted. When a correction signal is input with an input signal blocked, the level of an output signal is minimized.

In the image canceling circuit, the multiplier 11 can be omitted by setting an image signal suppression coefficient a for the multiplier 12 and an image signal suppression coefficient −a for the multiplier 13.

In the case where the image signal suppression varies with frequency due to the characteristics of a filter inserted at the output of a mixer, unless the level of a cancellation signal changes as much as the image signal suppression, the levels of the image signal and the cancellation signal are different and thus the image signal suppression performance is deteriorated according to frequency. To compensate frequency characteristics, an equalizer is used. Therefore, to compensate for changes in the frequency characteristics of an input signal of a mixer having I–Q amplitude and phase errors, an equalizer can be used, which removes the frequency characteristics changes, or compensates for the changes to maintain the I–Q errors constant regardless of frequency. A transversal FIR (Finite Impulse Response) filter is suitable as the equalizer, which uses a coefficient obtained by performing inverse Fourier Transform on the opposite of frequency characteristics having I–Q amplitude and phase errors.

In addition, the equalizer does not need to compensate for I–Q amplitude error-caused non-orthogonality.

Figure 2A:
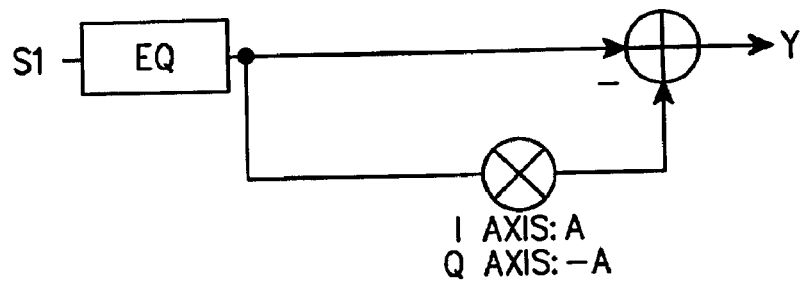
FIG. 2A illustrates an image canceling circuit having an equalizer inserted for a target signal according to the embodiment of the present invention.
Figure 2B:
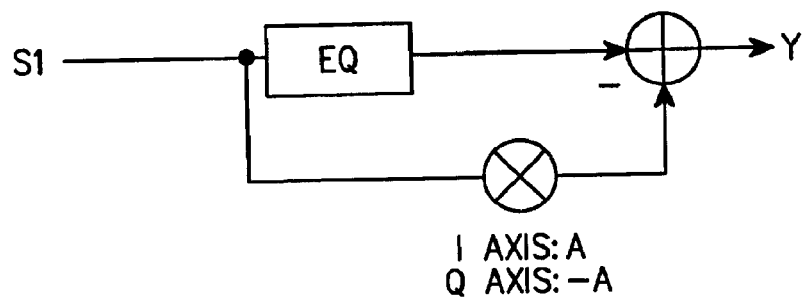
FIG. 2B illustrates an image canceling circuit having an equalizer inserted for the target signal only according to the embodiment of the present invention.
Figure 2C:
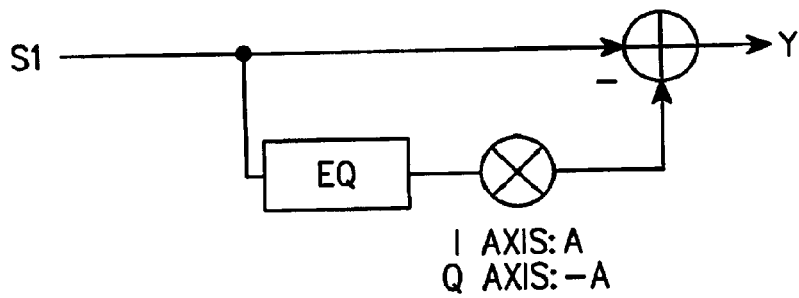
FIG. 2C illustrates an image canceling circuit having an equalizer inserted for a cancellation signal only according to the embodiment of the present invention.
Figure 2D:
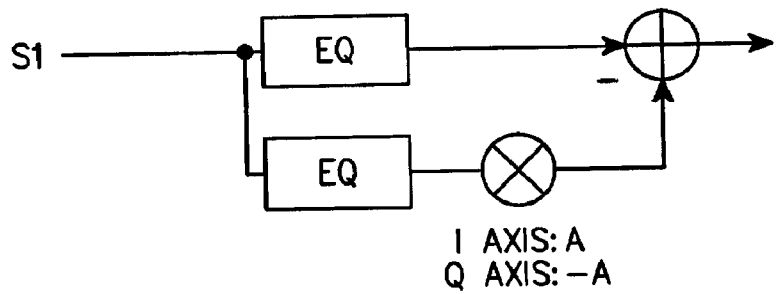
FIG. 2D illustrates an image canceling circuit having equalizers inserted for the target signal and the cancellation signal according to the embodiment of the present invention.

FIGS. 2A to 2D illustrate image canceling circuits having equalizers inserted at different positions according to the embodiment of the present invention. FIG. 2A illustrates an image canceling circuit having an equalizer for a target signal, FIG. 2B illustrates an image canceling circuit having an equalizer exclusively for the target signal, FIG. 2C illustrates an image canceling circuit having an equalizer exclusively for a cancellation signal, and FIG. 2D illustrates an image canceling circuit having equalizers for the target signal and the cancellation signal.

If the level of an input signal is great enough and there is a tolerance for associated precision, an equalizer can be inserted for the target signals S1,I and S1,Q, as shown in FIGS. 2A and 2B. If the input signal level is not great enough, an equalizer is inserted for the cancellation signals aS1,I and −aS1,Q, as shown in FIG. 2C. In the case where equalizers are inserted for both the target signals and the cancellation signals, as in FIG. 2D, the equalizer for the target signals operates for coarse compensation and the equalizer for the cancellation signals operates for fine compensation, so that the image signal is cancelled while maintaining the associated precision of the target signals.

Image signal cancellation requires very high accuracy and when the level setting for image signal cancellation is inaccurate, image frequency interference may become worse. Therefore, it is preferable to use an adaptive filter for the purpose of automatic adjustment. In this context, the coefficient a can be determined by adaptive signal processing. The coefficient a is adaptively determined such that the levels of the target signals are minimized, like calculation of the coefficient a that makes the level of an output signal minimized using a gradient method with respect to the target signals S1,I and S1,Q.

There will be given a description of the adaptive signal processing below.

Figure 3:
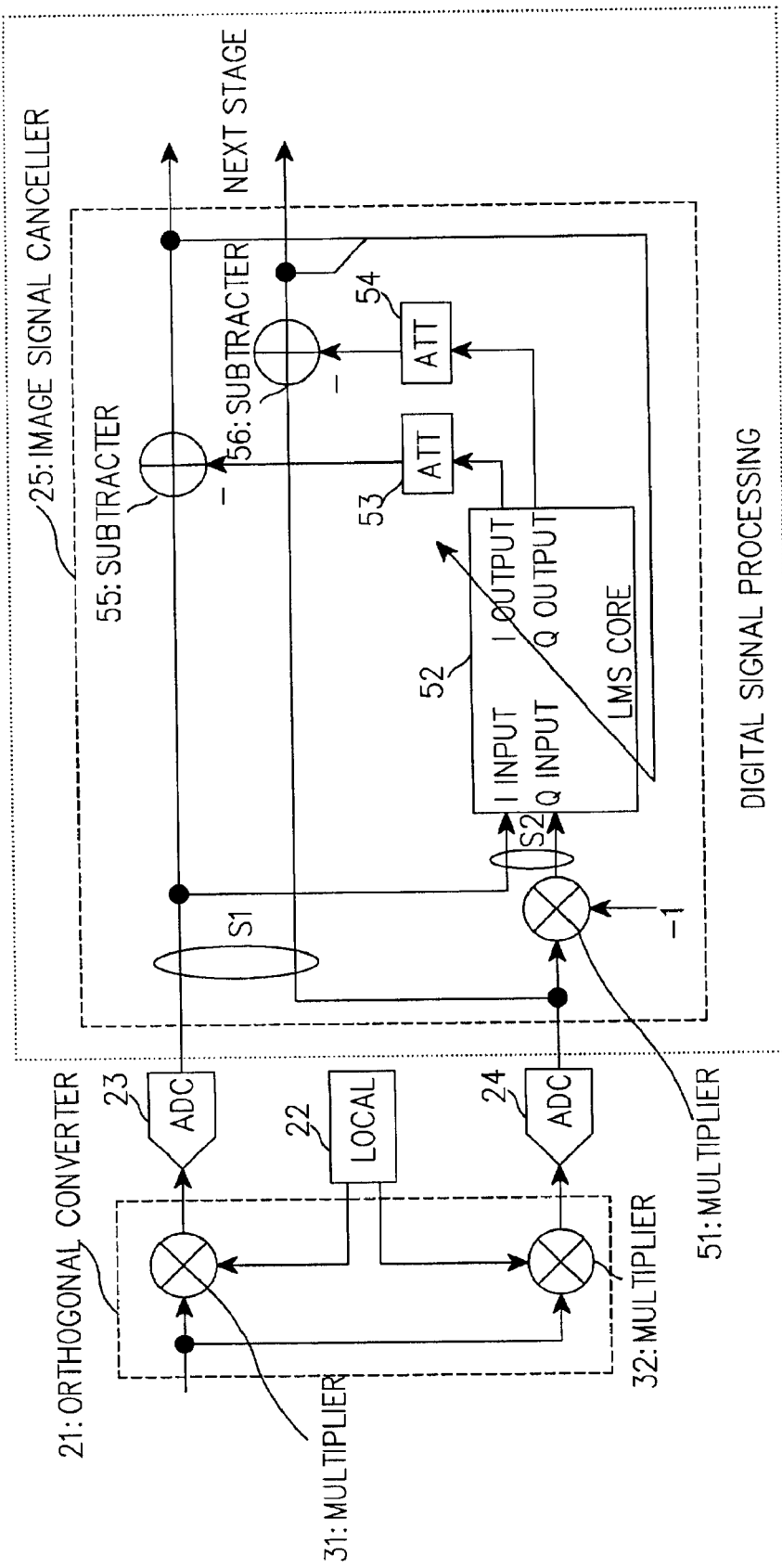
FIG. 3 illustrates the structure of a frequency converter according to the embodiment of the present invention.

FIG. 3 illustrates a frequency converter having an equalizer in the form of an adaptive filter positioned as shown in FIG. 2C, for the case that the coefficient a is determined using an adaptive filter according to the embodiment of the present invention. Referring to FIG. 3, an orthogonal converter 21 acts as an orthogonal demodulator which converts an input RF/IF real signal to a frequency that allows quantization and simultaneously converts the RF/IF real signal to a complex signal that can be represented on a phase-amplitude plane (I–Q plane). The orthogonal converter 21 includes a multiplier 31 for multiplying the RF/IF signal by the real part cos of a local signal generated from a local signal generator (Local) 22, and a multiplier 32 for multiplying the RF/IF signal by the imaginary part—sin of the local signal. The phase of the imaginary signal is different from that of the real signal by 90°. The outputs of these multipliers 31 and 32 include an amplitude or phase error that causes non-orthogonality between I and Q signals and an image signal is present in the output of the orthogonal converter 21.

An analog to digital converter ADC 23 quantizes the real part of the complex signal received from the orthogonal converter 21 by a sampling frequency two or more times the frequency of the complex signal, and an ADC 24 quantizes the imaginary part of the complex signal by the sampling frequency. An image signal canceller 25 being an application of the image canceling circuit shown in FIG. 1 cancels an image signal from the quantized complex signal.

The image signal canceller 25 is comprised of a multiplier 51 for generating the complex conjugate of the input complex signal by multiplying the imaginary part of the complex signal by −1 and thus inverting the sign of the imaginary signal, an LMS (least mean squares) core 52 being the main part of an adaptive filter, for controlling a coefficient of the filter using the input of the image signal canceller 25 as an error signal and the complex conjugate signal as a reference signal, a real signal attenuator (ATT) 53 and an imaginary signal attenuator (ATT) 54 for controlling the levels of the outputs of the LMS core 52 (cancellation signals), and a real signal subtracter 55 and an imaginary signal subtracter 56, for combining the cancellation signals adjusted by the attenuators 53 and 54 with the input complex signal.

The adaptive filter for the image signal canceller operates to minimize the difference between the image signal of the input complex signal S1 and the complex conjugate signal S2, as a reference signal, generated from the original signal of the image signal. Since complete error elimination is equivalent to perfect image rejection, the image rejection characteristics can be improved up to the adaptive accuracy limit of the adaptive filter.

In addition, the adaptive filter can achieve its coefficient by receiving a correction signal in adaptive processing.

Considering that the characteristics of an analog part do not change for a short time, if an image signal gradually varies on the time axis, there is no need for performing adaptive processing all the time. That is, adaptive processing is carried out for a predetermined time and the adaptive filter is operated as an equalizer using a calculated coefficient for the remaining time. This is repeatedly done.

The attenuators 53 and 54 for adjusting the levels of the outputs of the LMS core 52 are provided to make the filter coefficient word length of the LMS core 52 be minimum. Without the attenuators, the LMS core 52 changes the cancellation signals to the same level as the image signal by changing the coefficient, because the level of the image signal becomes lower than that of the complex conjugate signal S2 generated from the original signal of the image signal received as the reference signal to the adaptive filter. Decreasing the coefficient implies reduction of the filter coefficient word length.

The filter coefficient word length is in inverse proportion to the ratio of the image signal UI to the reference signal UD, UI/UD (the image signal suppression degree of the frequency converter). As the bit length of the coefficient (i.e., coefficient word length) decreases, the adaptive accuracy also decreases. Therefore, to realize good image rejection characteristics, an extra coefficient word length must be secured which allows maximum utilization of the filter coefficient word length. Insertion of the attenuators at the output of the filter obviates the need of reducing the filter output level by the filter coefficient and a minimum filter coefficient word length is enough. Furthermore, though it is possible to set the cancellation signal generated by a filter coefficient to the same level as an image signal in a transversal equalizer, the decreased coefficient makes it difficult to realize accurate equalizer characteristics. To avoid this problem, an extra coefficient word length needs to be secured. Insertion of the attenuators at the output of the equalizer allows the coefficient of the equalizer to be effective with a minimum coefficient word length.

Since the purpose lies in reducing image frequency interference, if a target signal is higher in level than an image signal and a desired D-U ratio (i.e., a ratio of wanted waves to interference waves) is ensured, there is no need for improving the D- ratio to excess to satisfy distortion characteristics in analog modulation and BER (bit error rate) in digital modulation. Accordingly, an equalizer or an adaptive filter is inoperative for this purpose. If the equalizer or adaptive filter is placed in the path of a target signal under such conditions, the signal can be processed through the equalizer or adaptive filter.

Suppose that a received signal level is RL, the image signal suppression degree of an orthogonal converter or a complex mixer is IMR, interference waves in the frequency band of the received signal become strong, and a D-U ratio at which the interference waves interfere with the received signal is C. When an image signal IML is greater than or equal to RL−C+IMR, the image signal generates disturbance.

If RL=−90 dBM, IMR=30 dB, and C=12 dB, IML=−90 −12 +30=−72 dBm. That is, if an image signal of −72 dBm or higher is present at an image frequency of a target signal, an image signal of −102 dBm(=−72 dBm−30 dB) or higher is generated in the output of a complex mixer. Therefore, the D-U ratio is 12 dB(=−90 dBm+102 dBm) or lower and image frequency cancellation is required. On the other hand, if the image signal level is −72 dBm or lower, the D-U ratio is 23 dB or higher and the image signal does not interfere with the target signal. Therefore, no image frequency cancellation is needed.

Figure 4A:
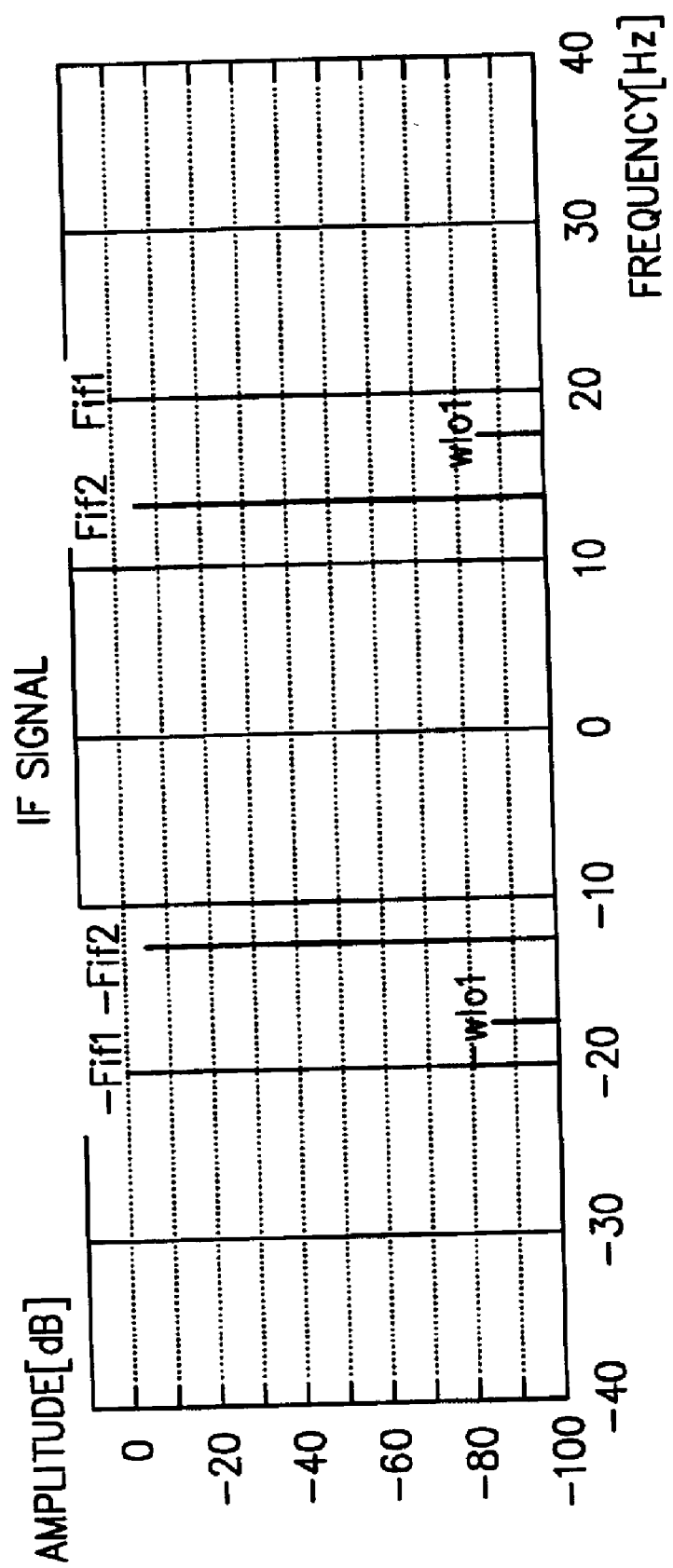
FIG. 4A illustrates the spectrum of IF signals input to the frequency converter.
Figure 4B:
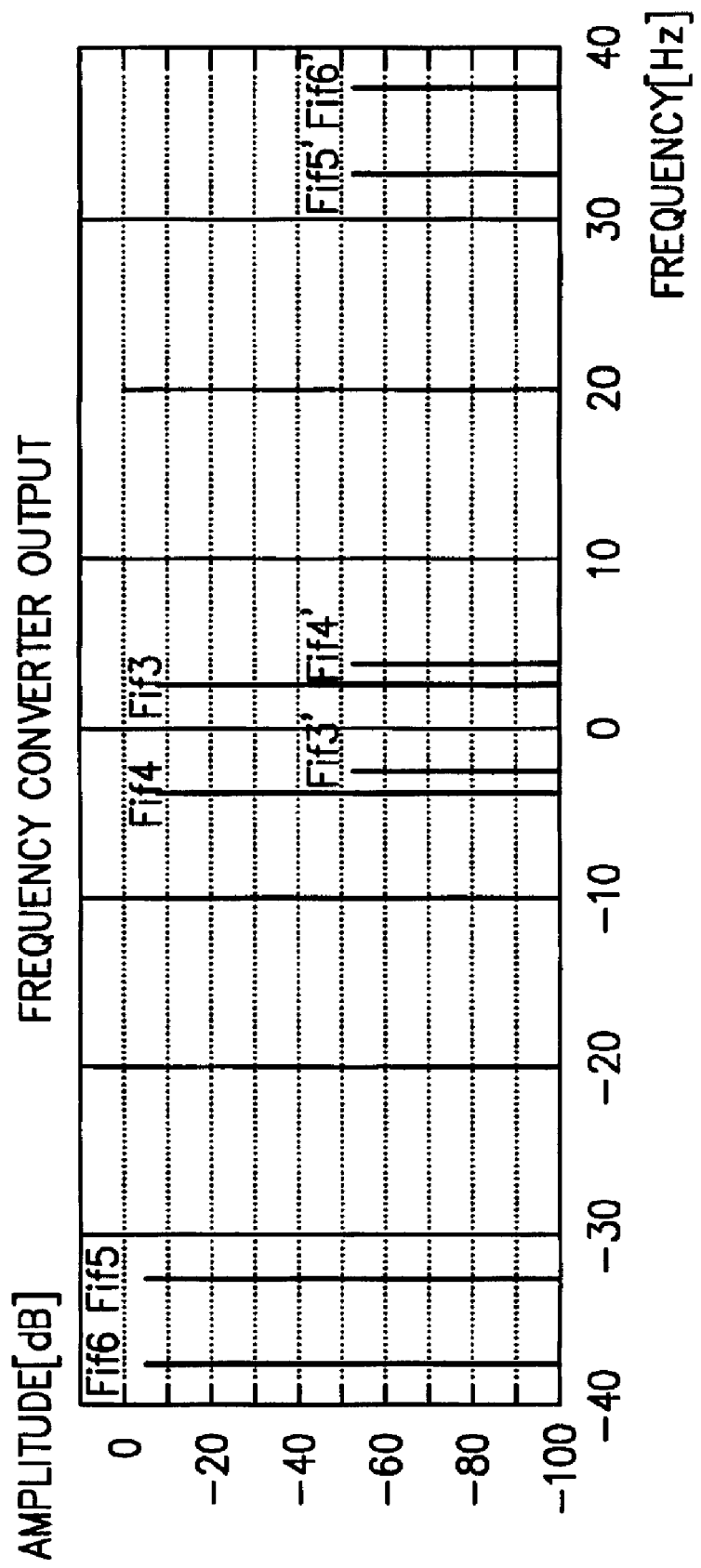
FIG. 4B illustrates the spectrum of the output of the frequency converter before orthogonality compensation.

FIGS. 4A and 4B illustrate a comparison in frequency spectrum between the input and output of the frequency converter before orthogonality compensation. FIG. 4A illustrates input frequency (IF) signals input to the frequency converter. Real signals of 20 Hz (Fif1) and 14.501953125 Hz (Fif2) at both sides of a complex local signal ($\omega$lo1) of the frequency converter of 17.998046875 Hz are input. FIG. 4B illustrates the outputs of the frequency converter before orthogonality compensation. The input signals are mixed with the complex local signal of 17.998046875 Hz, and IF signals of 20 Hz and 14.501953125 Hz are converted to signals of 2.001953125 Hz (Fif3) and −3.49609375 Hz (Fif4), respectively. Similarly, signals −Fif1 and −Fif2 symmetrical to the signals Fif1 and Fif2 with respect to direct current are converted to signals Fif5 and Fif6.

Signals Fif3', Fif4', Fif5' and Fif6' in the vicinity of −46 dB of the target signal are image signals when an error of 1% is present in the I-Q amplitude difference of the orthogonal converter 21 in the frequency converter. The frequencies of the image signals are the complex conjugate frequencies of the original signals Fif3, Fif4, Fif5 and Fif6.

Figure 5A:
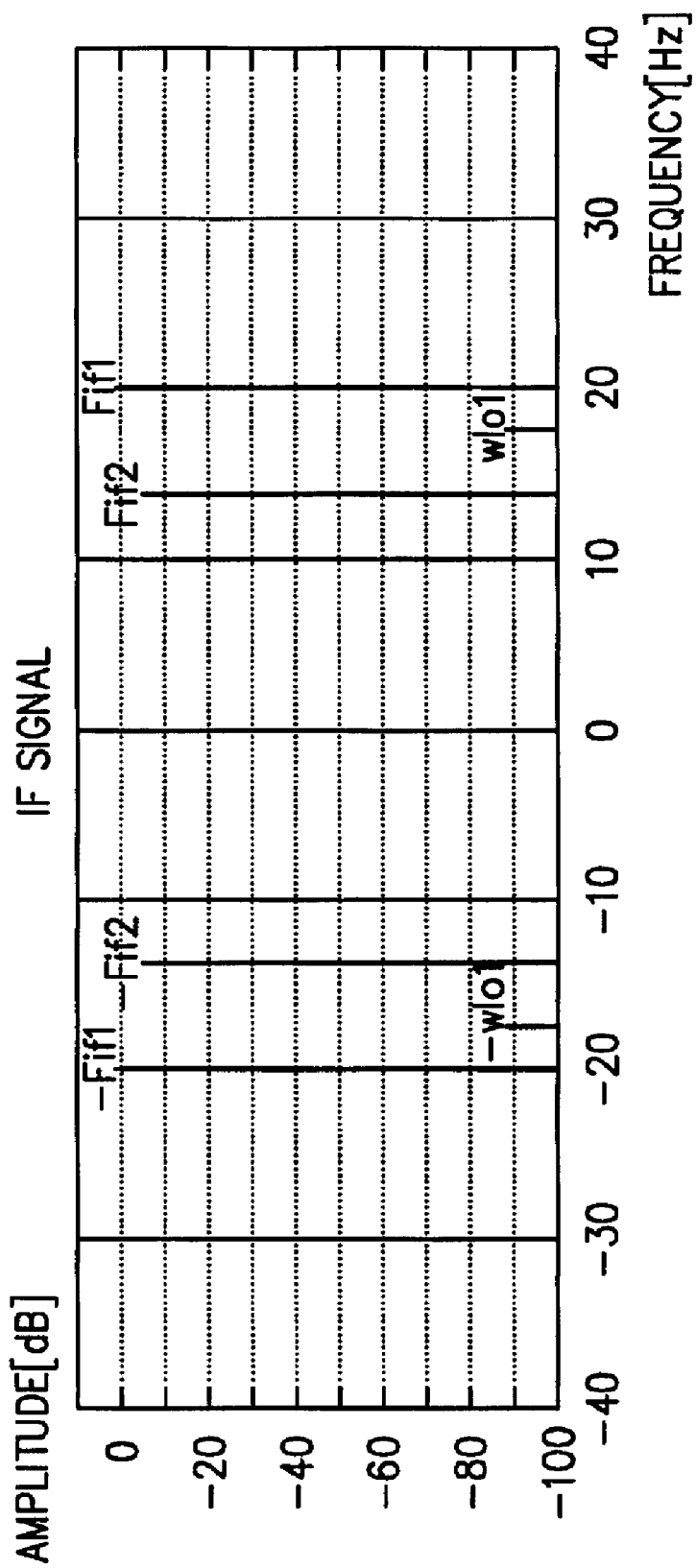
FIG. 5A illustrates the spectrum of the IF signals input to the frequency converter.
Figure 5B:
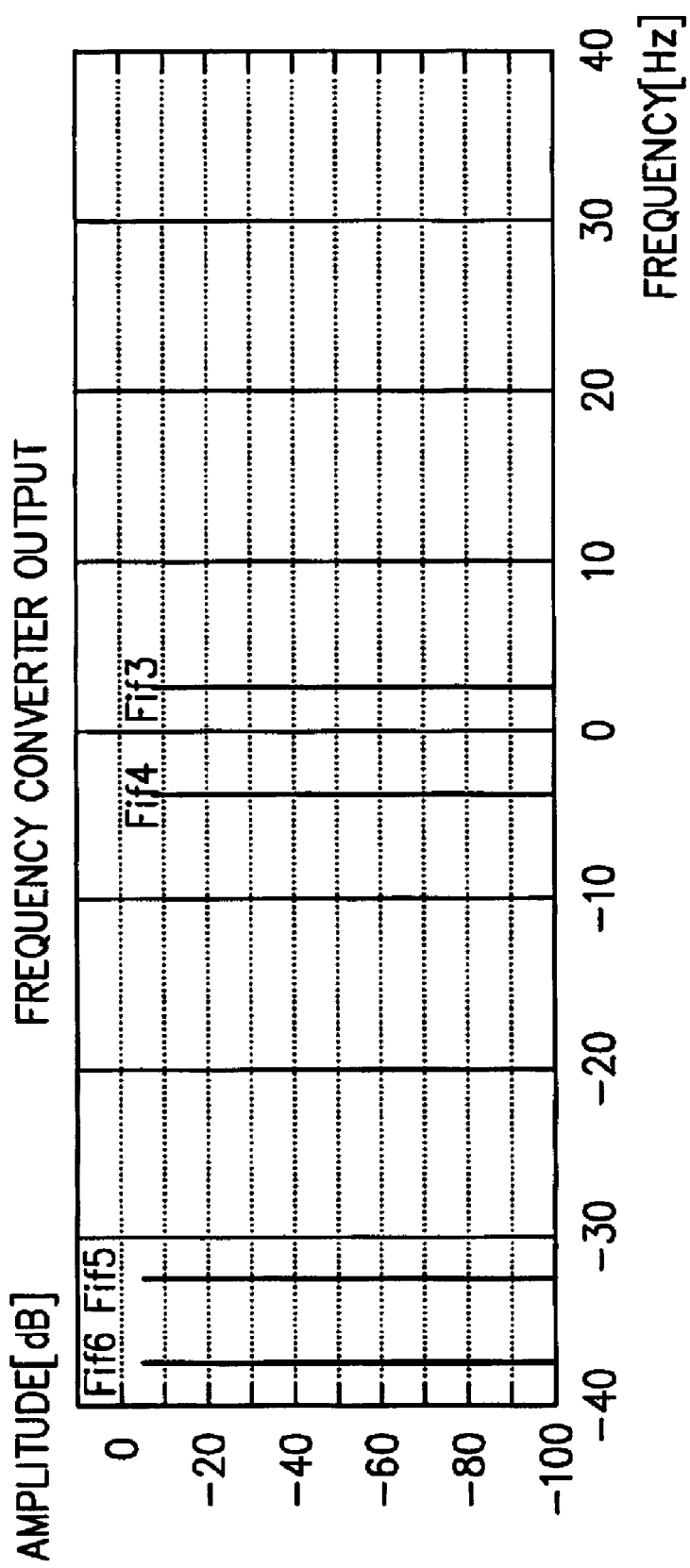
FIG. 5B illustrates the spectrum of the output of the frequency converter after orthogonality compensation.
Figure 7A:
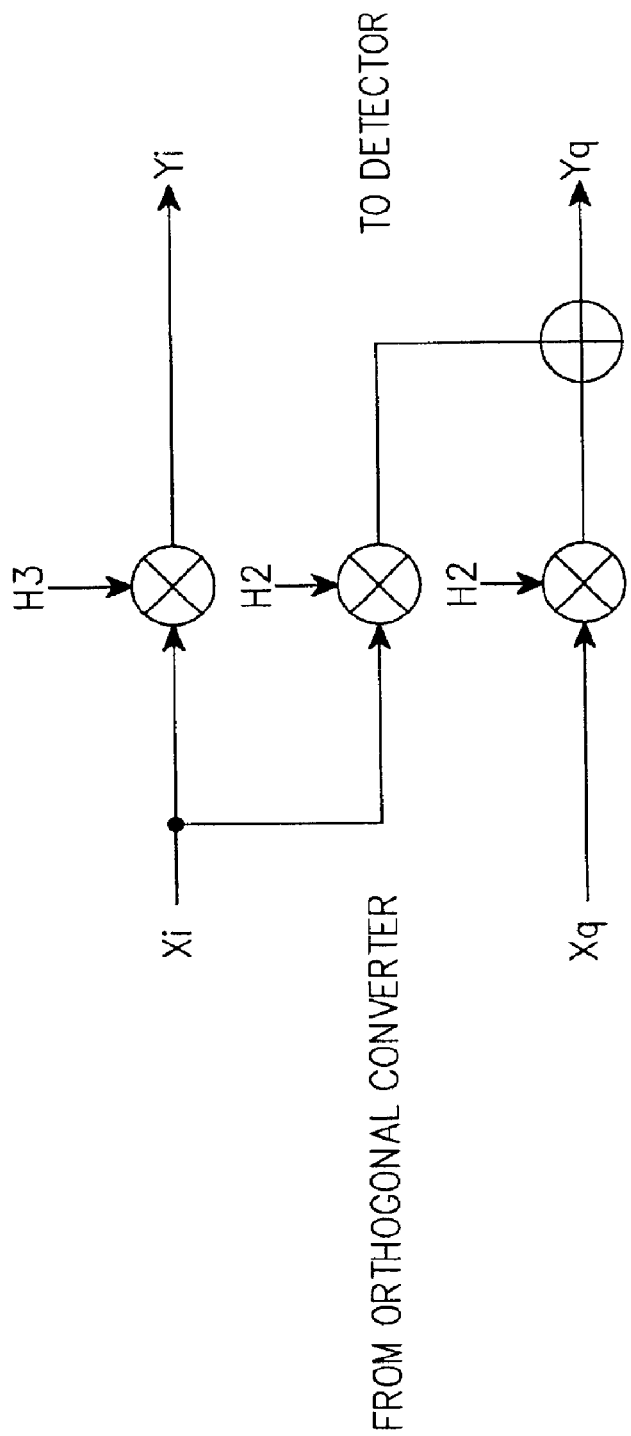

FIGS. 5A and 5B illustrate a comparison in frequency spectrum between the input and output of the frequency converter after orthogonality compensation. FIG. 5A illustrates IF signals input to the frequency converter and FIG. 5B illustrates the outputs of the frequency converter after orthogonality compensation. The input signals are mixed with the complex local signal of 17.998046875 Hz, and IF signals of 20 Hz and 14.501953125 Hz are converted to signals of 2.001953125 Hz (Fif3) and −3.49609375 Hz (Fif4), respectively. Similarly, signals −Fif1 and −Fif2 symmetrical to the signals Fif1 and Fif2 with respect to direct current are converted to signals Fif5 and Fif6.

However, the signals Fif3', Fif4', Fif5' and Fif6' in the vicinity of −46 dB of the target signal are removed in the frequency converter after orthogonality compensation.

While the above-described adaptive filter employs an LMS algorithm, any other adaptive algorithm can be used such as a gradient decent method or RLS (Recursive Least Square). Aside from the basic LMS algorithm, its applications can also be used such as a learning identification method. The LMS algorithms enable implementation of an adaptive system based on blind equalization without using a separate reference signal, using a relatively simple structure and less computations for an adaptive filter.

In the above-described image signal canceller, the adaptive filter determines the coefficient a while acting as an equalizer at the same time, but it can be configured to perform only the function of determining the coefficient a.

If an error signal level in the vicinity of 1 Hz is e and its band is B, the error power is B·e. Accordingly, each time the bandwidth is increased four times, all error power increases 6 dB and an extra operation word length of one bit is required to process signals with the same power resolution. Considering the error and band relation in terms of the response velocity of the adaptive filter, adaptive processing cannot be carried out with the same response velocity and accuracy unless the adaptive coefficient $\mu$ of the adaptive filter is decreased by ½ each time the bandwidth is increased twice. Hence, adaptive processing may be controlled only for a wanted band signal by multiplying a band limit by an error signal or a reference signal.

While the frequency converter realized by digital signal processing has been described, its function can be implemented by analog signal processing without quantization.

In accordance with the present invention, interference of an image frequency signal into a wanted band, caused by the non-orthogonality of an orthogonal converter or a complex mixer, can be suppressed to a wide band.

By suppressing a signal at the image frequency, which is the difference between a target signal frequency and a local oscillation signal frequency, from being an interference signal into the wanted band, a mixer having good image frequency interference cancellation characteristics can be realized and a transmitter with good radiation characteristics can be realized.

Moreover, a receiver having good adjacent channel selectivity and immunity to out-of-band interference can be achieved.

Use of simple adaptive processing such as LMS obviates the need for characteristic adjustment for the same performance and a complex operation circuit. The filter at the input of a mixer also obviates the need for an analog filter for removing an image signal. Consequently, circuit configuration is simplified, and cost and power consumption are reduced.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A frequency converter comprising:
    one of an orthogonal converter for receiving a real signal and outputting a complex signal, and a complex mixer for receiving a complex signal and outputting a complex signal;

means for obtaining the complex conjugate of the complex signal received from the one of the orthogonal converter and the complex mixer;

means for adjusting the level of the complex conjugate signal; and means for combining the complex signal received from the one of the orthogonal converter and the complex mixer with the level-adjusted complex conjugate signal.

2. A frequency converter comprising:

one of an orthogonal converter for receiving a real signal and outputting a complex signal, and a complex mixer for receiving a complex signal and outputting a complex signal;

a first multiplier for obtaining the complex conjugate of the complex signal received from the one of the orthogonal converter and the complex mixer by inverting the sign of the imaginary part of the complex signal;

a second multiplier for multiplying the real part of the complex conjugate signal by an integer predetermined to adjust the level of the complex conjugate signal;

a third multiplier for multiplying the imaginary part of the complex conjugate signal by the integer;

a first subtracter for subtracting the output of the second multiplier from the real part of the complex signal received from the one of the orthogonal converter and the complex mixer; and a second subtracter for subtracting the output of the third multiplier from the imaginary part of the complex signal received from the one of the orthogonal converter and the complex mixer.

3. A frequency converter comprising:

one of an orthogonal converter for receiving a real signal and outputting a complex signal, and a complex mixer for receiving a complex signal and outputting a complex signal;

a first multiplier for multiplying the real part of the complex signal received from the one of the orthogonal converter and the complex mixer by an integer predetermined to adjust signal level;

a second multiplier for inverting the sign of the imaginary part of the complex signal received from the one of the orthogonal converter and the complex mixer and multiplying the inverted imaginary part by the predetermined integer;

a first subtracter for subtracting the output of the first multiplier from the real part of the complex signal; and a second subtracter for subtracting the output of the second multiplier from the imaginary part of the complex signal.

4. A frequency converter comprising:

one of an orthogonal converter for receiving a real signal and outputting a complex signal, and a complex mixer for receiving a complex signal and outputting a complex signal;

an analog-to-digital converter (ADC) for quantizing the complex signal received from the one of the orthogonal converter and the complex mixer;

a first multiplier for obtaining the complex conjugate of the quantized complex signal by inverting the imaginary part of the quantized complex signal;

a second multiplier for multiplying the real part of the complex conjugate signal by an integer predetermined to adjust the level of the complex conjugate signal;

a third multiplier for multiplying the imaginary part of the complex conjugate signal by the predetermined integer;

a first subtracter for subtracting the output of the second multiplier from the real part of the complex signal received from the one of the orthogonal converter and the complex mixer; and a second subtracter for subtracting the output of the third multiplier from the imaginary part of the complex signal received from the one of the orthogonal converter and the complex mixer.

5. The frequency converter of claim 4, further comprising an equalizer inserted for one selected from the group of (i) the complex signal before a branching of the complex signal for complex conjugation, (ii) the complex signal after the complex signal branches for complex conjugation, (iii) the complex conjugate signal after the complex signal branches for complex conjugation, and (iv) both the complex signal and the complex conjugate signal after the complex signal branches for complex conjugation, to place the complex signal received from the one of the orthogonal converter and the complex mixer and the complex conjugate signal in a predetermined amplitude and phase relation.

6. The frequency converter of claim 5, wherein the equalizer is a transversal FIR (Finite Impulse Response) filter.

7. The frequency converter of claim 5, wherein the equalizer is an adaptive filter inserted for (iv) both the complex signal and the complex conjugate signal after the complex signal branches for complex conjugation, the adaptive filter using the complex output signal of the orthogonal converter as an input signal, the complex conjugate signal as a reference signal, the output of the frequency converter being a complex error signal.

8. The frequency converter of claim 7, wherein the adaptive filter uses an LMS-based algorithm.

9. The frequency converter of claim 7, further comprising a first attenuator and a second attenuator for adjusting the levels of the real and imaginary parts of the complex error signal output by the equalizer, wherein the first and second subtracters combine the outputs of the first and second attenuators with the complex signal received from the one of the orthogonal converter and the complex mixer.

10. The frequency converter of claim 7, wherein the adaptive filter determines a coefficient by receiving a correction signal.

11. The frequency converter of claim 7, wherein the adaptive filter calculates a coefficient by adaptive processing for a predetermined time and operates as an equalizer using the coefficient.

12. The frequency converter of claim 7, wherein the equalizer determines a quality measurement of the complex signal received from the one of the orthogonal converter and the complex mixer, the equalizer's performance of the frequency conversion being a function of the quality measurement.

13. The frequency converter of claim 4, wherein the integer is obtained by adaptive processing means.

14. The frequency converter of claim 13, wherein the adaptive processing means obtains the integer by receiving a correction signal.

15. The frequency converter of claim 13, wherein the adaptive processing means obtains the integer by adaptive processing at a predetermined time interval and adjusts the signal level of the complex conjugate signal using the integer for time remaining until a subsequent predetermined time interval.

16. The frequency converter of claim 7, wherein the one of the adaptive filter and the adaptive processing means limits the bandwidth of one of the reference signal and the error signal and performs adaptive processing on a wanted frequency band only.

17. A frequency converter comprising:
one of an orthogonal converter for receiving a real signal and outputting a complex signal, and a complex mixer for receiving a complex signal and outputting a complex signal;
an ADC for quantizing the complex signal received from the one of the orthogonal converter and the complex mixer;
a first multiplier for multiplying the real part of the quantized complex signal by an integer predetermined to adjust signal level;
a second multiplier for inverting the sign of the imaginary part of the quantized complex signal and multiplying the inverted imaginary part by the predetermined integer;
a first subtracter for subtracting the output of the first multiplier from the real part of the complex signal; and
a second subtracter for subtracting the output of the second multiplier from the imaginary part of the complex signal.

18. The frequency converter of claim 17, further comprising an equalizer inserted for one selected from the group of (i) the complex signal before a branching of the complex signal for complex conjugation, (ii) the complex signal after the complex signal branches complex conjugation, (iii) the complex conjugate signal after the complex signal branches from complex conjugation, and (iv) both the complex signal and the complex conjugate signal after the complex signal branches for complex conjugation, to place the complex signal received from the one of the orthogonal converter and the complex mixer and the complex conjugate signal in a predetermined amplitude and phase relation.

19. The frequency converter of claim 18, wherein the equalizer is a transversal FIR (Finite Impulse Response) filter.

20. The frequency converter of claim 18, wherein the equalizer is an adaptive filter inserted for (iv) both the complex signal and the complex conjugate signal after the complex signal branches for complex conjugation, the adaptive filter using the complex output signal of the orthogonal converter as an input signal, the complex conjugate signal as a reference signal, the output of the frequency converter being a complex error signal.

21. The frequency converter of claim 20, wherein the adaptive filter uses an LMS-based algorithm.

22. The frequency converter of claim 20, further comprising a first attenuator and a second attenuator for adjusting the levels of the real and imaginary parts of the complex error signal output by the equalizer, wherein the first and second subtracters combine the outputs of the first and second attenuators with the complex signal received from one of the the orthogonal converter and the complex mixer.

23. The frequency converter of claim 20, wherein the adaptive filter determines a coefficient by receiving a correction signal.

24. The frequency converter of claim 20, wherein the adaptive filter calculates a coefficient by adaptive processing for a predetermined time and operates as an equalizer using the coefficient.

25. The frequency converter of claim 20, wherein the equalizer determines a quality measurement of the complex signal received from the one of the orthogonal converter and the complex mixer, the equalizer's performance of the frequency conversion being a function of the quality measurement.

26. The frequency converter of claim 17, wherein the integer is obtained by adaptive processing means.

27. The frequency converter of claim 26, wherein the adaptive processing means obtains the integer by receiving a correction signal.

28. The frequency converter of claim 26, wherein the adaptive processing means obtains the integer by adaptive processing at a predetermined time interval and adjusts the signal level of the complex conjugate signal using the integer for time remaining until a subsequent predetermined time interval.

29. The frequency converter of claim 17, wherein the one of the adaptive filter and the adaptive processing means limits the bandwidth of one of the reference signal and the error signal and performs adaptive processing on a wanted frequency band only.

* * * * *